(12) United States Patent
Bryant et al.

(10) Patent No.: US 6,333,230 B1
(45) Date of Patent: Dec. 25, 2001

(54) SCALABLE HIGH-VOLTAGE DEVICES

(75) Inventors: Andres Bryant; William F. Clark, Jr.; Edward J. Nowak; Kirk D. Peterson, all of Essex Junction; Minh H. Tong, Essex, all of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/571,055

(22) Filed: May 15, 2000

(51) Int. Cl.[7] .................................................. H01L 21/336
(52) U.S. Cl. ............................................. 438/270; 438/245
(58) Field of Search ..................................... 438/223, 241, 438/245, 262, 270, 291, 361, 404, 268, 272, 425

(56) References Cited

U.S. PATENT DOCUMENTS

| | | | |
|---|---|---|---|
| 4,590,663 | 5/1986 | Haken | 29/571 |
| 4,689,871 | * 9/1987 | Malhi | 438/270 |
| 4,931,850 | 6/1990 | Yamada | 357/23.11 |
| 5,151,759 | 9/1992 | Vinal | 357/23.3 |
| 5,472,887 | 12/1995 | Hutter et al. | 437/34 |
| 5,489,543 | * 2/1996 | Hong | 437/41 |
| 5,571,738 | * 11/1996 | Krivokapic | 438/291 |
| 5,629,638 | 5/1997 | Kumar | 326/121 |
| 5,687,355 | 11/1997 | Joardar et al. | 395/500 |
| 5,750,435 | 5/1998 | Pan | 438/525 |
| 5,792,699 | 8/1998 | Tsui | 438/290 |

* cited by examiner

*Primary Examiner*—David Nelms
*Assistant Examiner*—Phuc T. Dang
(74) *Attorney, Agent, or Firm*—Mark Chadurjian; Cantor Colburn LLP

(57) ABSTRACT

A method of fabricating a semiconductor device comprising: forming a trench on the face of a silicon substrate of a first conductivity type; depositing a conformal silicon layer of a second conductivity type into the trench; etching away the silicon layer of a second conductivity type selectively to leave portions of the silicon layer in the trench; annealing to drive dopant from the portions of the silicon layer through the walls of the trench into adjacent areas of the silicon substrate; and forming a gate structure in the trench, and source and drain diffusion regions in said silicon substrate on opposing sides of said gate structure.

10 Claims, 3 Drawing Sheets

SCALABLE HIGH-VOLTAGE DEVICES

BACKGROUND OF THE INVENTION

The present invention relates to the fabrication of integrated circuit devices on semiconductor substrates. In particular, the present invention relates to a high voltage CMOS FET device which allows scalability, and a method of fabricating such a device.

In complementary metal oxide semiconductor (CMOS) technology, a need to enhance the speed and increase the density of CMOS integrated circuits (ICs) has resulted in the evolution of transistor scaling, generally accompanied with the requirement of lowering the supply voltage proportionately. One of the key problems is the source-to-drain (S/D) punch through, which is pronounced when the S/D voltage is high and the field effect transistor (FET) channel length is short.

Several solutions to the problem of accommodating high S/D voltage have been devised. One such solution provides for the use of a V-gate FET (shown in FIG. 2 and discussed below). However, such a structure exhibits a lack of scalability, in particular in regard to the channel length. Another approach to address the high source to drain voltage issues is the U-gate FET (UFET), shown in FIG. 3 and discussed below. The major drawback presented by the UFET is the corners of the polysilicon gate under which the inversion channels might not be formed properly.

SUMMARY OF THE INVENTION

Now, according to the present invention, a high voltage FET device has been developed which features scalability and hence a device density advantage. The present invention uses a modified UFET type device structure in which first conductivity type silicon substrate areas under the corners of a polysilicon gate are doped to be a second conductivity type silicon substrate, such that inversion is not needed. A method to fabricate such an improved device also has been developed.

BRIEF DESCRIPTION OF THE DRAWINGS

For further understanding of the present invention, reference should be made to the following detailed description of the preferred embodiments, taken in conjunction with the accompanying drawings in which like elements have been designated with like numerals in each of the Figures, and wherein.

DETAILED DESCRIPTION OF THE INVENTION

Figure 1:
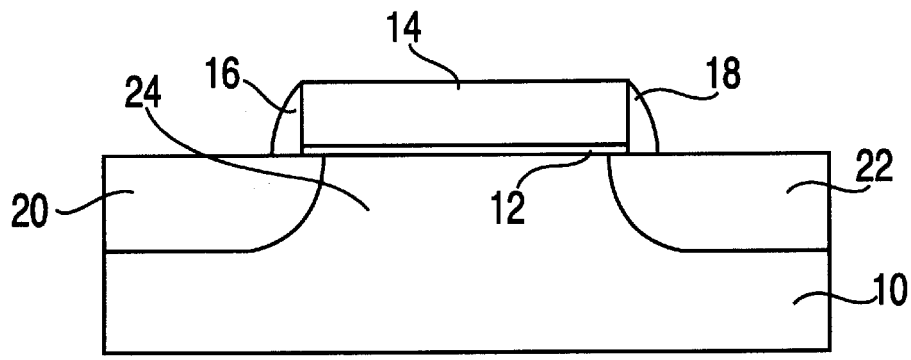
FIG. 1 is a cross-sectional illustration of a standard thin-oxide n-type FET (NFET).

Referring to the drawings, FIG. 1 represents a standard thin-oxide NFET type device comprising a p-type silicon substrate 10 upon which a layer of gate silicon oxide 12 has been grown and a polysilicon gate 14 formed with spacers 16 and 18 on the sidewalls thereof. A first n+ diffusion source region 20 and a second n+ diffusion drain region 22 are laterally displaced on either side of channel region 24 and in alignment with gate 14. Such a standard NFET device suffers from the problem of drain 22 to source 20 punch through when source drain voltage is high and the FET channel 24 length is short. Accordingly, scalability is a major issue.

Figure 2:
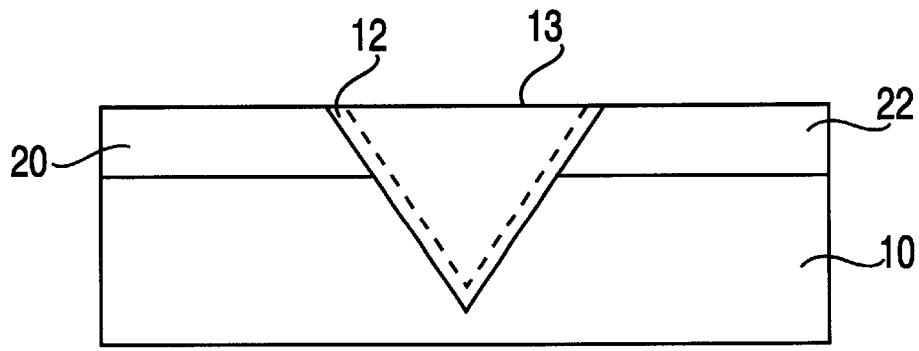
FIG. 2 is a cross-section of a typical V-gate NFET.

FIG. 2 illustrates a previously proposed solution to the high voltage punch through problem. In this NFET structure, commonly referred to as a V-gate NFET, the polysilicon gate 13 appears as a V-shape in cross section, as shown. However, while this structure design addresses the problem of high S/D voltage source-to-drain punch through, it is not adaptable to scaling, especially in regard to channel length.

Figure 3:
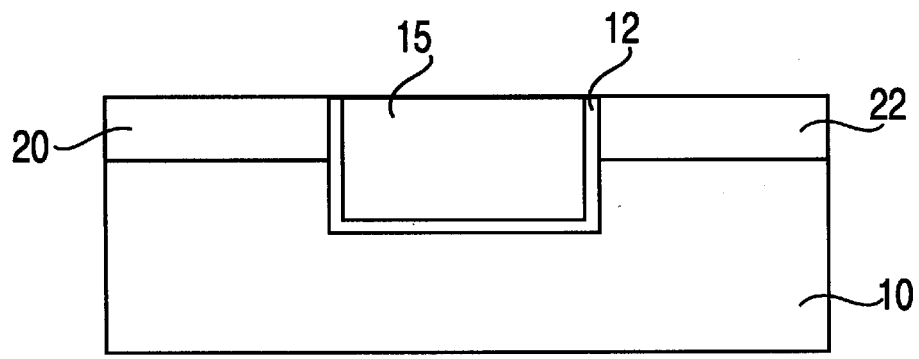
FIG. 3 depicts a cross-sectional representation of a typical U-gate high voltage NFET.

Another approach to solve the problems of high source-to-drain voltage is illustrated in FIG. 3 wherein formation of a U-shaped polysilicon gate structure 15 isolated from substrate 10 by oxide dielectric barrier layer 12 results in a U-gate FET (UFET) device structure. The UFET accommodates high S/D voltage and allows scaling of source to drain spacing as well as sufficiently long channel length. Nevertheless, a drawback remains regarding the gate corners under which inversion channels might not be formed properly, resulting in channel length discontinuity.

Figure 4:
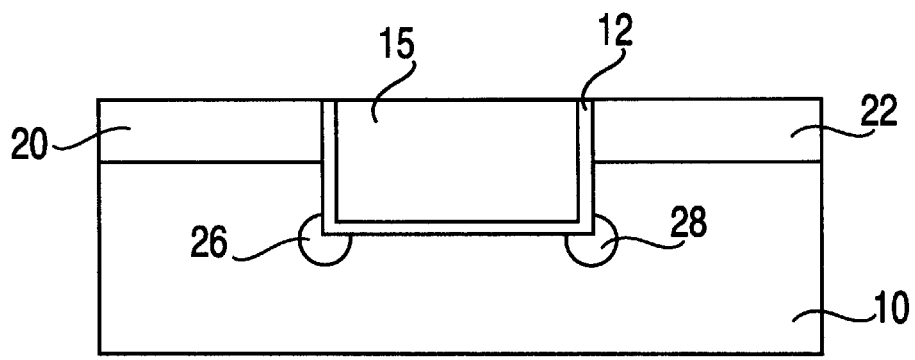
FIG. 4 is a cross-sectional view of an improved UFET pursuant to the present invention.

The improved device structure according to the present invention is depicted in FIG. 4. The device resembles the previously described UFET shown in FIG. 3 with the distinction of featuring regions of n+ type silicon, conduction enhancement regions, in the form of pockets 26 and 28 within the p-type substrate abutting the vertical side surfaces and horizontal bottom surface of the gate structure 15. Inversion is not needed. Accordingly, the invented semiconductor device comprises a silicon substrate doped to be a first conductivity type; a conductive gate structure extending into said substrate and electrically isolated from said substrate by a dielectric barrier layer; diffusion regions doped to be a second conductivity type located at the surface of said substrate on opposing sides of said gate structure; and conduction enhancement regions doped to be a second conductivity type in said substrate abutting the dielectric layer and below the level of the diffusion regions. This improved U-gate high voltage NFET allows for scaling of source 20 to drain 22 spacing, and further maintains sufficiently long channel length.

Figure 5:
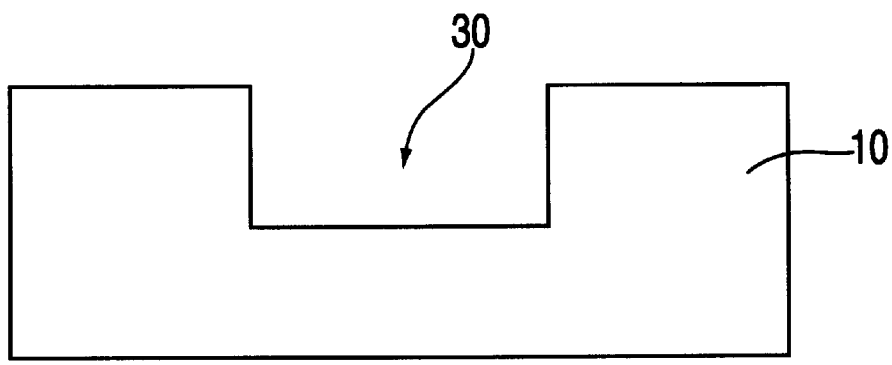
FIG. 5 is a cross-sectional illustration of a portion of p-type silicon semiconductor substrate in which a trench has been formed.
Figure 6:
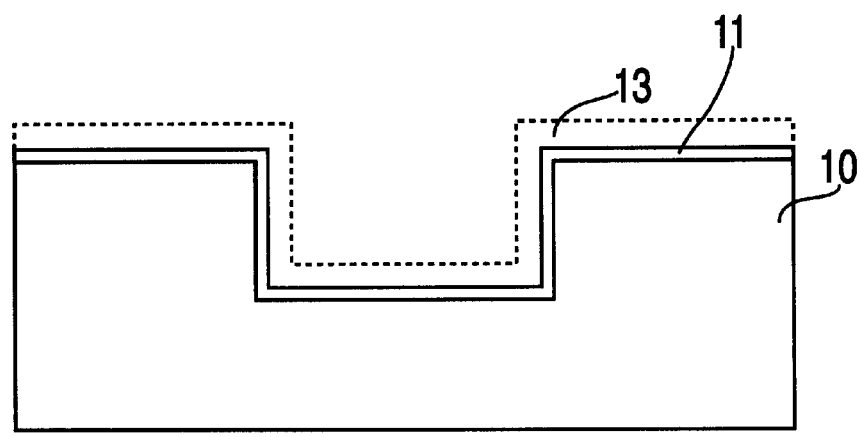
FIG. 6 depicts the structure of FIG. 5 following deposition of n+ doped polysilicon into the formed trench.
Figure 7:
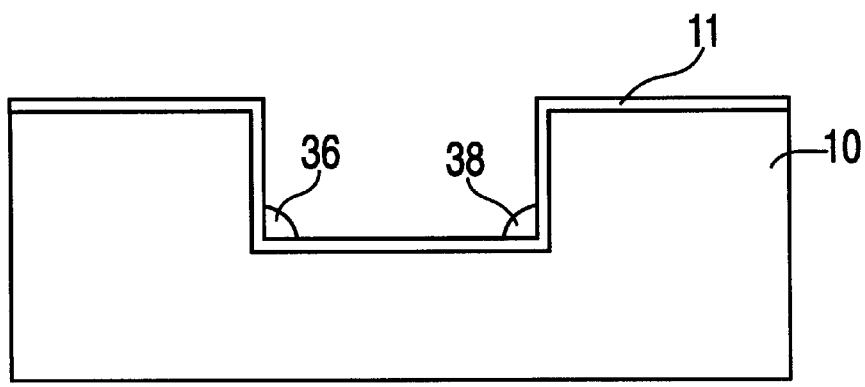
FIG. 7 depicts the structure of FIG. 7 after the n+ doped polysilicon has been subjected to reactive ion etching.
Figure 8:
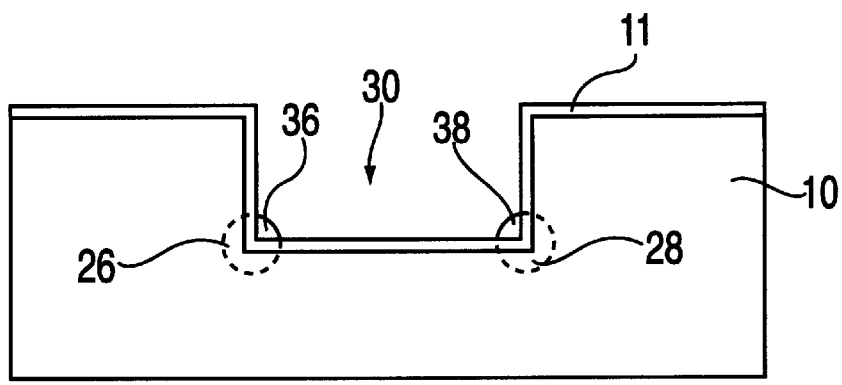
FIG. 8 depicts the structure of FIG. 7 after n+ diffusion pockets have been formed at the corners of the trench.

FIGS. 5 through 10 illustrate one embodiment of a fabrication process for forming the improved NFET device depicted in FIG. 4. In FIG. 5, a portion of p-type silicon substrate 10 is shown having trench 30 formed therein. Trench 30 can be patterned into the silicon substrate 10 using conventional photolithographic and reactive ion etching (RIE) techniques. An etch barrier layer then is formed over the substrate 10. This barrier layer may be any suitable material, such as silicon oxide, silicon nitride, polyimide, a GeSi alloy, and the like. As shown in FIG. 6, a thin layer of oxide 11 is grown over the substrate 10. This oxide layer 11 can be grown by heating the substrate 10 at a temperature of between about 800° C. and about 1000° C. for between about 10 and about 60 minutes in the presence of oxygen. Next, a conformal layer of n+ doped polysilicon 13 is deposited over the surface of substrate 10. This polysilicon layer typically can be applied by standard chemical vapor deposition (CVD) techniques. After the n+ polysilicon layer 13 has been deposited, it then is etched away, by such techniques as plasma etching. In FIG. 7, it is shown that the polysilicon etch, however, is specifically limited in duration, so as intentionally to leave polysilicon shoulder portions 36 and 38 in the corners of trench 30. As illustrated in FIG. 8, in order to drive the dopant from the remaining n+ doped polysilicon portions 36 and 38 through the trench bottom sidewalls into adjacent portions of the silicon substrate 10 at the corners of the gate polysilicon to form n+ diffusion pockets 26 and 28, the substrate is annealed, generally at a temperature ranging from about 1000° C. to about 1100° C. for about 15 minutes to about 30 seconds.

Figure 9:
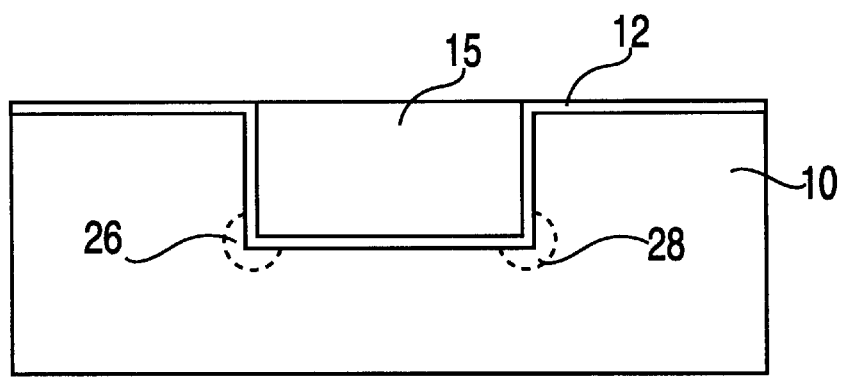
FIG. 9 depicts the structure of FIG. 8 after a gate structure has been formed in the trench.
Figure 10:
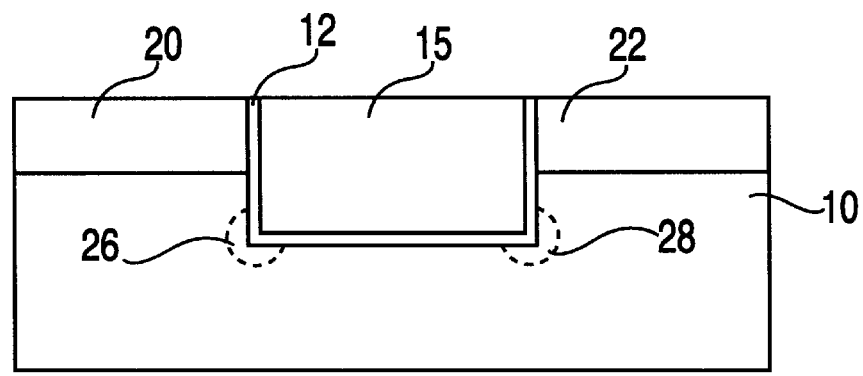
FIG. 10 depicts the structure of FIG. 9 after n+ diffusion regions have been formed on opposing sides of the gate to result in the FET device of the present invention.

Preferably, as seen in FIG. 9, the remaining polysilicon shoulder portions 36 and 38 and oxide layer 11 are then removed, by standard techniques such as plasma etching, and then an oxide layer 12 is re-grown, a new layer of n+ doped polysilicon 15 is deposited to cover the surface of substrate 10 and fill trench 30. The substrate with a polysilicon-filled trench 30 then is subjected to chemical mechanical polishing (CMP), using, for example, a polishing pad and a silica slurry polishing medium. The polysilicon is polished down to the level of the substrate, leaving the trench filled with a block of polysilicon 15, forming a gate structure. Finally, as shown in FIG. 10, source/drain diffusion regions 20 and 22 then are formed at the surface of the substrate 10, laterally displaced on either side of the gate structure. In the embodiment shown, source diffusion region 20 and drain diffusion region 22 include an n+ type impurity, such as phosphorous or arsenic.

While the invention has been described with reference to specific embodiments thereof, it is intended that all matter contained in the above description or shown in the accompanying drawings be interpreted as illustrative and not limiting in nature. For example, the present invention may similarly be employed with p-channel devices to form high voltage PFET (e.g., by reversing the conductivity types of the source/drain, gate, pocket, and body channel regions). Various other modifications of the disclosed embodiments, as well as other embodiments of the invention, will be apparent to those skilled in the art upon reference to this description, or may be made without departing from the spirit and scope of the invention defined in the appended claims.

We claim:

1. A method of fabricating a semiconductor device comprising:

forming a trench on the face of a silicon substrate of a first conductivity type;

depositing a conformal silicon layer of a second conductivity type into the trench;

etching away the silicon layer of a second conductivity type selectively to leave remaining portions of the silicon layer in the trench;

driving dopant from the remaining portions of the silicon layer through the walls of the trench into adjacent areas of the silicon substrate; and forming a gate structure in the trench, and source and drain diffusion regions in said silicon substrate on opposing sides of said gate structure.

2. The method of claim 1 comprising forming a barrier layer over said substrate following said forming a trench and prior to depositing said conformal silicon layer into the trench.

3. The method of claim 1 comprising removing the portions of silicon of a second conductivity type from the trench following said annealing and prior to forming a gate structure in the trench.

4. The method of claim 1, wherein:

said silicon substrate comprises a p-type substrate; and said conformal layer comprises n+ type polysilicon.

5. The method of claim 1 comprising etching the silicon layer of a second conductivity type selectively to leave remaining portions in the form of shoulders in corners of said trench.

6. The method of claim 1 comprising annealing to drive dopant from the remaining portions of the silicon layer through the walls of the trench.

7. A method of fabricating a semiconductor device comprising:

forming a trench on the face of a silicon substrate of a first conductivity type;

forming a barrier layer over the substrate;

depositing a conformal silicon layer of a second conductivity type into the trench;

etching away the silicon layer of a second conductivity type selectively to leave remaining shoulder portions of the silicon layer in corners of the trench;

annealing to drive dopant from the remaining portions of the silicon layer through walls of the trench into adjacent areas of the silicon substrate;

removing the remaining portions of silicon from the trench; and, forming a gate structure in the trench and source and drain diffusion regions in said silicon substrate on opposing sides of said gate structure.

8. A semiconductor device comprising:

a silicon substrate doped to be a first conductivity type;

a conductive gate structure extending into said substrate and electrically isolated from said substrate by a dielectric barrier layer;

diffusion regions doped to be a second conductivity type located at the surface of said substrate on opposing sides of said gate structure; and conduction enhancement regions doped to be a second conductivity type in said substrate abutting the dielectric layer and below the level of the diffusion regions, said conduction enhancement regions further comprising pockets adjacent to bottom corners of the gate structure.

9. The semiconductor device of claim 8 wherein said conductive gate structure comprises vertical side surfaces and a horizontal bottom surface.

10. The semiconductor device of claim 9 wherein each of said conduction enhancement regions abut a horizontal and vertical surface of the dielectric barrier layer.

* * * * *